United States Patent [19]

Ahramjian

[11] 4,337,130
[45] Jun. 29, 1982

[54] PHOTOCURABLE POLYURETHANE FILM COATINGS

[75] Inventor: Leo Ahramjian, Wilmington, Del.

[73] Assignee: E. I. Du Pont de Nemours and Company, Wilmington, Del.

[21] Appl. No.: 244,531

[22] Filed: Mar. 26, 1981

Related U.S. Application Data

[63] Continuation-in-part of Ser. No. 162,915, Jun. 25, 1980, abandoned.

[51] Int. Cl.³ ............................ C08F 2/50; C08J 3/28
[52] U.S. Cl. ......................... 204/159.15; 204/159.19; 525/28; 525/440; 528/75; 524/873; 524/539
[58] Field of Search ................... 204/159.15, 159.19; 525/28, 440; 528/75

[56] References Cited

U.S. PATENT DOCUMENTS

| | | | |
|---|---|---|---|
| 2,948,611 | 8/1960 | Barney | 96/35 |
| 3,912,516 | 10/1975 | Recchia | 204/159.15 |
| 3,979,548 | 9/1976 | Schafer et al. | 428/425 |
| 4,013,806 | 3/1977 | Volkert et al. | 204/159.19 |

*Primary Examiner*—John C. Bleutge
*Assistant Examiner*—Arthur H. Koeckert

[57] ABSTRACT

A photopolymerizable polyurethane composition comprising (1) a polyurethane based on an aliphatic diisocyanate, poly(hexamethylene isophthalate glycol) and, optionally, 1,4-butanediol; (2) a polyfunctional acrylic ester; (3) a photoinitiator; and (4) an anti-oxidant, can be formulated so that it provides a hard, abrasion-resistant, and stain-resistant finish for floor tiles or so that it can be used as a scratch-resistant and stain-resistant outer coating for bilayer automotive safety glass assemblies.

14 Claims, No Drawings ic # PHOTOCURABLE POLYURETHANE FILM COATINGS

CROSS-REFERENCE TO RELATED APPLICATION

This is a continuation-in-part of my copending application Ser. No. 162,915, filed June 25, 1980, now abandoned.

BACKGROUND OF THE INVENTION

This invention relates to a novel polyurethane composition characterized by excellent transparency, hardness, and stain and scratch resistance, which is particularly suitable for such applications as no-wax floor finishes end for single glass sheet safety glass constructions. The ever-growing energy crisis has imposed on automobile manufacturers the obligation to reduce automobile weight in order to improve fuel economy. As one of small but significant contributions to the weight reduction, it has been proposed to replace the conventional automobile safety glass, presently made of two glass sheets held together by a clear plastic interlayer, by a single glass sheet backed by a transparent synthetic polymer layer, such as plasticized polyvinyl butyral or a polyurethane, to improve impact resistance.

While use of polyurethane compositions both in floor finishes and in safety glass construction is known, it has always been difficult to combine in one product good stain and scratch resistance since those properties are generally considered to be incompatible with each other. It thus is desirable to provide polyurethane compositions having a good balance of properties, including good stain and scratch resistance.

U.S. Pat. No. 3,979,548 to Schäfer et al. describes a polyurethane composition suitable as a scratch-resistant coating on the interior surface of automobile safety glass. In order to preserve the desirable physical properties of the cured polyurethane during bonding at an elevated temperature, nonstoichiometric amounts of the polyol component and the polyisocyanate component are used, the proportion of the former being larger than calculated.

SUMMARY OF THE INVENTION

According to this invention, there is now provided a photocurable polyurethane composition consisting essentially of the following components:

(1) a polyurethane made from
  (a) an aliphatic diisocyanate,
  (b) a poly(hexamethylene isophthalate)glycol having a number average molecular weight of about 500–1600, and
  (c) 1,4-butanediol; with the provisos that the respective mole ratios of components (a), (b), and (c) are 1–2:1:0–1; and the total amount of components (b) and (c) is about equivalent to the amount of component (a);
(2) a photopolymerizable polyfunctional acrylate or methacrylate ester in an amount of about 2–15% based on the weight of component (1);
(3) an amount of a photoinitiator effective to cause component (2) to polymerize in the presence of ultraviolet light; and
(4) an antioxidant.

As an alternative, there is also provided a composition in which component (1) is made in situ. In such a composition, there are present, instead of component (1), its constituent components (a), (b) and (c), as well as a catalyst which promotes the urethane formation.

DETAILED DESCRIPTION OF THE INVENTION

There are at present three commercial aliphatic diisocyanates available in the United States in large quantities at a reasonable price, namely, 4,4'-methylenebis(cyclohexyl isocyanate), sold as Desmodur ® W (Mobay); 1-isocyanato-2-isocyanatomethyl-3,5,5-trimethylcyclohexane, known in the industry as isophorone diisocyanate (Veba-Chemie); and an —NCO terminated biuret based on 1,6-hexamethylene diisocyanate, sold as Desmodur ® N (Mobay or Bayer). The preferred diisocyanate is 4,4'-methylenebis(cyclohexyl isocyanate), also known in the industry as PICM, whose symmetrical structure and secondary —NCO groups permit close control of its reactions and good predictability of the structure of its reaction products. PICM is available as a mixture of trans,trans; cis,cis; and trans,cis isomers. The preferred commercial grade of PICM is the so-called PICM-20, which contains about 18–24% of the trans,trans isomer. Other commercial grades contain higher proportions of the trans,trans isomer, up to about 70%.

The use of poly(hexamethylene isophthalate) glycol in the polyurethane component of the compositions of this invention is critical to their success in their intended applications. This glycol is available from Hooker Chemical Company. Although a composition comprising an aliphatic polyurethane and a photopolymerizable acrylic component was known and recommended to the public by E. I. du Pont de Nemours and Company prior to the date of the present invention, that prior art polyurethane was based on polycaprolactone glycol rather than on poly(hexamethylene isophthalate)glycol, and the composition did not have the outstanding properties of the compositions of the present invention. This earlier polyurethane composition was recommended for fabric coatings.

One skilled in the art will be able to decide whether or not 1,4-butanediol should also be used in the polyurethane preparation. This short chain, low molecular weight diol contributes some hardness or stiffness, and its use in the compositions of the present invention lowers their overall material cost.

It is preferred to form component (1) in situ from the diisocyanate (a) and glycol (b) or mixture of glycol (b) and diol (c), in the presence of the photopolymerizable acrylic or methacrylic ester and the remaining components. A catalyst is necessary to promote the urethane formation. Typical catalysts, which are well known to the art, include, among others, tertiary amines, various metal salts, especially tin salts, and organometallic compounds, especially organotin compounds. Typical tertiary amine catalysts include tributylamine, N-methylmorpholine, and triethylenediamine. Typical tin salts and organotin compounds are stannous octoate, stannous oleate, and dibutyltin dilaurate. Naturally, other catalysts known to a polyurethane chemist can be used equally well. The amount of the catalyst should be effective to produce the desired polyurethane under the usual polyurethane reaction conditions. Its usual concentration will be about 0.01–3% based on the total weight of components (a), (b) and (c).

The polyfunctional acrylate or methacrylate, component (2) of the compositions of the present invention, is an ester of a diol or polyol and acrylic acid or methacrylic acid. Typical diols and polyols from which such esters may be formed include ethylene glycol, trimethylolpropane, pentaerythritol, sorbitol, resorcinol, and hydroquinone. Many esters of those diols and polyols with acrylic or methacrylic acid are commercially available. The preferred ester is trimethylolpropane trimethacrylate, especially when present in the compositions of this invention in a proportion of about 8% based on the weight of the polyurethane component.

A photoinitiator, which is used in the present compositions to polymerize component (2), can be any of the well-known photoinitiators including, for example, diacetyl, benzoin, acyloin ethers, and aromatic ketones and aldehydes. A suitable photoinitiator is, for example, 2,2-diethoxyacetophenone (DEAP) available from Union Carbide. The amount of the photoinitiator normally is about 0.1–5% based on the combined weights of components (1) and (2).

Any antioxidant useful in polymer compositions can be used in the compositions of the present invention. The preferred antioxidants, which do not cause discoloration, are phenolic compounds. Typical phenolic antioxidants include, for example, 2,6-di-t-butyl-4-methylphenol, available from Shell Chemical under the name Ionol®; 2,6-di-t-butylphenol, known as Ethyl Antioxidant 701 (Ethyl Corporation); and Antioxidant 2246 from American Cyanamid Company, which is 2,2'-methylenebis(4-methyl-6-t-butylphenol). The amount of antioxidant must be sufficient to prevent thermal polymerization of the photocurable component (2) during the polyurethane curing step, but not so much that it interferes with the subsequent photocuring. This amount can be readily determined experimentally, but it is recommended that about 0.1–0.5% based on the weight of component (1) or its constituent components (a), (b) and (c) be used.

In the practical preparation of the compositions of the present invention, the polyurethane component (1) may be prepared separately and then be combined with the photopolymerizable component (2) and the photoinitiator. However, the alternative procedure, wherein the polyurethane is prepared in situ, is preferred. When this procedure is observed, all the ingredients are premixed at, say 60°–70° C.; the urethane reaction promoting catalyst is added; and the mixture is degassed and heated at about 100° C. for about one hour. The resulting composition can then be formed into a film, laminated to a substrate, and cured by ultraviolet light. This cured film offers excellent mechanical protection against scratches and is stain resistant. Both of these advantages are particularly desirable for protecting vinyl or other resilient flooring materials. When used in single glass sheet automobile safety glass, the compositions of the present invention are laminated to the soft, clear plastic material normally used as interlayer. The laminated, harder surface of the compositions of the present invention would normally face inwards. The soft plastic layer would, as before, protect the glass from shattering, while the cured harder polyurethane finish of this invention would provide protection of the soft plastic from mechanical damage or, for example, cigarette smoke discoloration, and would make the necessary tight contact with the automobile body frame gaskets.

It is recognized that the same composition cannot satisfy all the requirements for a hard floor finish and for a somewhat softer windshield backcoat, and that different testing procedures may be required in each case. The floor surface must resist abrasion, maintain gloss, and resist dirt pickup. The most suitable windshield coating should be soft enough to mend easily after scratching but hard enough to resist staining; yet, it is not required that it resist dirt pickup to the same extent as a floor finish. These different requirements can be best satisfied by adjusting the diisocyanate/polyester glycol/1,4-butanediol proportions of the polyurethane component (1), as will be shown below, depending on the intended application of each composition. While those preferred proportions are shown for PICM-20 only, one skilled in the art will be able to easily establish the optimum proportions of components for the other aliphatic isocyanates. In order to obtain the desired degree of hardness with "isophorone diisocyanate," one should slightly increase the mole proportion of the diisocyanate and then correspondingly increase the amount of 1,4-butanediol to maintain the overall stoichiometric ratio of —OH to —NCO groups. When Desmodur® N is used, the proportion of this —NCO terminated biuret should be slightly decreased, and the amount of 1,4-butanediol would have to be decreased accordingly. Similarly, when PICM-50, PICM-70, or any other commercial PICM in which the proportion of the trans,trans isomer is higher than about 24% is used, its proportion as well as the proportion of 1,4-butanediol should be decreased.

This invention is now illustrated by the following examples of certain representative embodiments thereof, wherein parts, proportions, and percentages are expressed by weight, unless indicated to be mole ratios.

EXAMPLE 1

A mixture of 535 g (0.5 mole) of a poly(hexamethylene isophthalate)glycol having a number average molecular weight of 1080, 197 g (0.75 mole) of 4,4'-methylenebis(cyclohexyl isocyanate) containing 20% trans,trans isomer (PICM-20), 22.5 g (0.25 mole) of 1,4-butanediol, 65.6 g of trimethylolpropane trimethacrylate, 1.6 g of Ionol®, and 6.4 g of 2,2-diethoxyacetophenone was heated to 65° C. Dibutyltin dilaurate, 0.15 g, was added; the mixture was quickly degassed; the resultant product was poured into a polytetrafluoroethylene-coated pan and heated for 1 hr. at 100° C. The polymeric product was pressed between Mylar® polyester film at 150° C. to a thickness of 0.013–0.018 cm. It was then vacuum laminated to smooth floor tiles at 95° C. and photocured under nitrogen with a Linde Interfocused UV lamp. The tiles moved past the lamp at a rate of 9.1 m/min. The physical properties of the free film according to ASTM D2240 and D412 were determined to be as follows:

TABLE 1

| Cured Film Properties | |
| --- | --- |
| Hardness, Shore D | 60 |
| Modulus at 100% elongation (MPa) | 18.6 |
| Tensile Strength (MPa) | 64 |
| Elongation at Break, % | 250 |

The properties of the film laminated to the tiles were further determined in the following practical tests:

TABLE 2

| Laminated Tile Properties | |
| --- | --- |
| Stain Resistance[1] | Excellent |
| Gloss Retention[2] | Very Good |

TABLE 2-continued

| Laminated Tile Properties | |
|---|---|
| Scratch Resistance[3] | Good |
| Dirt Pickup[3] | Good |

[1] Permanent staining after being contacted for 30 min. with the following agents and then wiped clean: 1% N-phenyl-α-naphthylamine in paraffin oil, Du Pont "yellow" stain (0.5% solution of Du Pont "Oil Yellow" liquid gasoline dye in mineral oil), mustard, lipstick.
[2] After 150 cycles on a Gardner Washability Tester with 10% Ajax® cleanser and nylon bristles.
[3] After a 6 min. indoor walk with pieces of coated tiles taped to shoe soles.

The above results show that a composition in which the PICM/glycol/butanediol mole ratio is 1.5:1:0.5 is useful as a floor tile finish.

EXAMPLE 2

The product of Example 1 (Sample A), which had a diisocyanate/polyester glycol/1,4-butanediol mole ratio of 1.5/1.0/0.5, was compared with two polyurethanes prepared according to the method of Example 1 using the same reactants in the following PICM/polyester glycol/1,4-butanediol ratios: 2.0/1.0/1.0 (Sample B) and 1.25/1.0/0.25 (Sample C). The proportions of the other components in all samples, based on the weight of polyurethane, were as follows:

TABLE 3

| | % |
|---|---|
| Trimethylolpropane trimethacrylate | 8 |
| Ionol® | 0.2 |
| Diethoxyacetophenone | 0.8 |
| Dibutyltin dilaurate | 0.03 |

TABLE 4

| | Sample A | Sample B | Sample C |
|---|---|---|---|
| Cured Film Properties | | | |
| Hardness, Shore D | 60 | 70 | 56 |
| Modulus at 100% elongation, MPa | 18.6 | 25.5 | 12.1 |
| Tensile Strength, MPa | 64 | 44.8 | 31.0 |
| Elongation at break, % | 300 | 220 | 375 |
| Laminated Tile Properties | | | |
| Stain Resistance | Excellent | Excellent | Excellent |
| Gloss Retention | Very Good | Fair | Good |
| Scratch Resistance | Good | Fair | Fair |
| Dirt Pickup | Good | Good | Poor |

Cured film properties and tile properties were determined as in Example 1. It can be seen that samples B and C are inferior to Sample A in floor tile finish applications.

EXAMPLE 3

A 0.013 cm thick film of an uncured polyurethane, Sample C of Example 2, was laminated at 100° C. to the polyurethane side of a bilayer windshield assembly consisting of a 0.64 cm thick glass and a 0.08 cm thick coating of an impact-resistant polyurethane prepared as follows:

To a mixture of 1,336 g of 4,4'-methylenebis(cyclohexyl isocyanate), 2000 g of poly(tetramethyleneether)glycol having a number average molecular weight of about 1000, and 279 g of 1,4-butanediol there was added at room temperature 0.08 g of dibutyltin dilaurate. The mixture was agitated and warmed to 70° C., at which temperature it was clear and reacted with sufficient rapidity to raise the temperature slightly. The mixture was degassed, poured into a 30×30×3.8 cm mold, and cured for 16 hr. at 100° C. The polymeric product was pressed between Mylar® polyester film at 150° C. to a thickness of 0.08 cm.

Other polyurethane compositions were prepared in the same manner using different PICM/polyester glycol/1,4-butanediol ratios. In two samples the photocurable acrylic component also was varied. Films 0.013 cm thick were laminated to the polyurethane side of identical bilayer windshield assemblies, photocured, and tested in the same manner. It can be seen from Table 5 that Sample C had the best combination of scratch and stain resistance.

TABLE 5

| Sample No. | PICM/GLYCOL/DIOL Molar Ratio | Polyacrylate Type[a] | %[b] |
|---|---|---|---|
| 1 (C) | 1.25/1.0/0.25 | TMPTMA | 8 |
| 2 (A) | 1.5/1.0/0.5 | TMPTMA | 8 |
| 3 (B) | 2.0/1.0/1.0 | TMPTMA | 8 |
| 4 | 2.3/1.0/0.3 | TMPTMA | 8 |
| 5 | 1.0/1.0/0 | TMPTMA | 8 |
| 6 | 1.5/1.0/0.5 | TMPTA | 8 |
| 7 | 1.5/1.0/0.5 | PETA | 8 |

| Sample No. | Scratch Resistance[c] | Stain Resistance[d] |
|---|---|---|
| 1 (C) | Good | Excellent |
| 2 (A) | Fair | Excellent |
| 3 (B) | Fair-Poor | Excellent |
| 4 | Fair-Poor | Excellent |
| 5 | Good | Fair-Good |
| 6 | Fair-Poor | Excellent |
| 7 | Poor | Excellent |

[a] TMPTMA - trimethylolpropane trimethacrylate
TMPTA - trimethylolpropane triacrylate
PETA - pentaerythritol triacrylate
[b] Based on the urethane component itself.
[c] Recovery after scratching with sharp object.
[d] Permanent staining after contact with Du Pont "yellow" stain for 30 min., then wiped clean.

I claim:

1. A photocurable polyurethane composition consisting essentially of the following components:
   (1) a polyurethane made from
      (a) an aliphatic diisocyanate,
      (b) a poly(hexamethylene isophthalate)glycol having a number average molecular weight of about 500-1600, and
      (c) 1,4-butanediol; with the provisos that the respective mole ratios of components (a), (b), and (c) are 1-2:1:0-1; and the total amount of components (b) and (c) is about equivalent to the amount of component (a);
   (2) a photopolymerizable polyfunctional acrylate or methacrylate ester in an amount of about 2-15% based on the weight of component (1);
   (3) an amount of a photoinitiator effective to cause component (2) to polymerize in the presence of ultraviolet light; and
   (4) an antioxidant.

2. A composition of claim 1 wherein component (1) is prepared in situ from ingredients (a), (b), and (c) in the presence of a catalyst which promotes the urethane formation.

3. A composition of claim 1 wherein the aliphatic diisocyanate is selected from the group consisting of 4,4'-methylenebis(cyclohexyl isocyanate), 1-isocyanato-2-isocyanatomethyl-3,5,5-trimethylcyclohexane, and isocyanate-terminated biuret based on 1,6-hexamethylene diisocyanate.

4. A composition of claim 3 wherein the diisocyanate is 4,4'-methylenebis(cyclohexyl isocyanate).

5. A composition of claim 4 wherein the diisocyanate contains about 18-24% of the trans,trans isomer.

6. A composition of claim 1 wherein component (2) is selected from the group consisting of trimethylolpropane trimethacrylate, trimethylolpropane triacrylate, and pentaerythritol triacrylate.

7. A composition of claim 6 wherein component (2) is trimethylolpropane trimethacrylate.

8. A composition of claim 7 wherein the proportion of component (2) is about 8% based on the weight of component (1).

9. A composition of claim 2 wherein the urethane-promoting catalyst is present in an amount of about 0.01-3% based on the total weight of components (a), (b), and (c).

10. A composition of claim 1 wherein the amount of the antioxidant is 0.1-0.5% based on the combined weights of components (1) and (2).

11. A composition of claim 5 wherein the respective mole ratios of constituent components (a), (b), and (c) of component (1) are about 1.5/1.0/0.5.

12. A composition of claim 11 wherein component (2) is trimethylolpropane trimethacrylate.

13. A composition of claim 5 wherein the respective mole ratios of constituent components (a), (b), and (c) are about 1.25/1.0/0.25.

14. A composition of claim 13 wherein component (2) is trimethylolpropane trimethacrylate.

* * * * *